(12) United States Patent
Zhao et al.

(10) Patent No.: US 11,908,716 B2
(45) Date of Patent: Feb. 20, 2024

(54) IMAGE-BASED IN-SITU PROCESS MONITORING

(71) Applicant: Applied Materials, Inc., Santa Clara, CA (US)

(72) Inventors: Guoheng Zhao, Palo Alto, CA (US); Venkatakaushik Voleti, Milpitas, CA (US); Todd Egan, Fremont, CA (US); Kyle R. Tantiwong, Livermore, CA (US); Andreas Schulze, Campbell, CA (US); Niranjan Ramchandra Khasgiwale, San Jose, CA (US); Mehdi Vaez-Iravani, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 151 days.

(21) Appl. No.: 17/321,366

(22) Filed: May 14, 2021

(65) Prior Publication Data
US 2022/0367217 A1    Nov. 17, 2022

(51) Int. Cl.
*H01L 21/67*    (2006.01)
*C23C 16/52*    (2006.01)
(Continued)

(52) U.S. Cl.
CPC ........ *H01L 21/67253* (2013.01); *C23C 16/52* (2013.01); *G01N 21/55* (2013.01); *H01L 21/67069* (2013.01); *H01L 22/12* (2013.01)

(58) Field of Classification Search
CPC ... C23C 16/52; G01N 21/55; H01J 37/32577; H01J 37/32917; H01J 37/32935;
(Continued)

(56) References Cited

U.S. PATENT DOCUMENTS 5,293,216 A * 3/1994 Moslehi ............. G03F 7/70483
                                                                    356/600
2003/0056899 A1    3/2003 Hanazaki
(Continued)

FOREIGN PATENT DOCUMENTS

JP    2006-196578 A    7/2006

OTHER PUBLICATIONS

International Search Report and Written Opinion for Application No. PCT/US2022/025891, dated Aug. 9, 2022, 9 pages.
(Continued)

*Primary Examiner* — Sunghee Y Gray
(74) *Attorney, Agent, or Firm* — Kilpatrick Townsend & Stockton LLP

(57) ABSTRACT

Methods and systems for monitoring etch or deposition processes using image-based in-situ process monitoring techniques include illuminating a measurement area on a sample disposed in a process chamber. The measurement area is illuminated using an input beam generated remote from the process chamber and transmitted to a first viewing window of the process chamber by a first optical fiber. Portions of the first input beam reflected from the measurement area are transmitted from the first viewing window to an imaging sensor by a second optical fiber. A sequence of images is obtained at the imaging sensor, and a change in reflectance of pixels within each of the images is determined. The etch or deposition process is monitored based on the change in reflectance.

14 Claims, 8 Drawing Sheets

(51) Int. Cl.
*G01N 21/55* (2014.01)
*H01L 21/66* (2006.01)

(58) Field of Classification Search
CPC ......... H01J 37/32972; H01L 21/67069; H01L 21/67103; H01L 21/67253; H01L 21/6831; H01L 21/68792; H01L 22/12; H01L 22/20
USPC ........................................................ 356/477
See application file for complete search history.

(56) References Cited

U.S. PATENT DOCUMENTS

| | | | |
|---|---|---|---|
| 2008/0175988 A1* | 7/2008 | Chiu | C23C 16/45519 |
| | | | 427/249.1 |
| 2017/0297140 A1* | 10/2017 | Taminger | B23K 15/02 |
| 2018/0061691 A1 | 3/2018 | Jain et al. | |
| 2018/0277377 A1 | 9/2018 | Eto et al. | |
| 2021/0134684 A1 | 5/2021 | Ansell et al. | |

OTHER PUBLICATIONS

International Preliminary Report on Patentability for Application No. PCT/US2022/025891, dated Nov. 14, 2023, 6 pages.

* cited by examiner

IMAGE-BASED IN-SITU PROCESS MONITORING

FIELD

Embodiments described herein relate generally to monitoring semiconductor manufacturing processes using image-based measurements, and more particularly to in-situ process monitoring based on changes in reflectance of pixels in images.

BACKGROUND

There are many manufacturing processes that are involved either directly or indirectly in the manufacture of semiconductor devices. Processing steps that occur numerous times in the manufacture of semiconductor wafers, for example, include film deposition and etching processes. Among the many issues that need to be optimized and monitored in a deposition chamber, the ability to monitor deposition rate is especially important. Among the many issues that need to be optimized and monitored in an etch chamber, the ability to monitor etch rate, as well as detecting an end point of the etching process, are especially important.

Using etch as an example, monitoring has traditionally been achieved using interferometric end-pointing (IEP) techniques. IEP techniques typically involve illuminating a given area on a surface of a wafer with broadband light and monitoring reflected light using a spectrometer. Changes in thickness alter the spectrum of the reflected light, and by noting the spectrum as a function of time, the etch rate and end point can be determined.

IEP techniques are based on average reflectance over a relatively large measurement area (for example, on the order of a few millimeters squared). IEP techniques may be satisfactory in some cases, such as monitoring processes on unpatterned samples or on samples that generally have uniform patterns or similar structures. However, if the structure on a sample includes different types of patterns or different structures, IEP techniques cannot provide specific details associated with small regions within a measurement area.

Thus, there is a need to provide in-situ process monitoring at a resolution that can detect changes in sub-regions of a measurement area in etching, deposition, and other semiconductor manufacturing processes.

SUMMARY

Embodiments described herein provide image-based in-situ process monitoring techniques that improve spatial resolution. Semiconductor manufacturing processes, such as etch or deposition processes, can be monitored using imaging techniques, where changes in reflectance of each pixel or groups of pixels in an image can be determined in-situ. Resolution can be determined by imaging optics and sensors, allowing processes to be monitored based on changes in sub-regions of measurement areas.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a method for monitoring an etch or deposition process using image-based in-situ process monitoring. The method also includes illuminating a measurement area on a sample disposed in a process chamber using a first input beam having a first peak wavelength, the first input beam generated remote from the process chamber and transmitted to a first viewing window of the process chamber by a first optical fiber. The method also includes receiving portions of the first input beam reflected from the measurement area at an imaging sensor as a first reflected beam, the first reflected beam transmitted from the first viewing window of the process chamber to the imaging sensor by a second optical fiber. The method also includes obtaining a sequence of first images of the measurement area using the first reflected beam received at the imaging sensor, each of the first images obtained at a different time within a monitoring period, and each of the first images including first pixels corresponding to different parts of the measurement area. The method also includes determining a first reflectance of one or more of the first pixels within each of the first images, the one or more of the first pixels corresponding to areas of interest within the measurement area. The method also includes determining a first change in the reflectance of the one or more of the first pixels between adjacent first images in the sequence. The method also includes monitoring the etch or deposition process based on the first change in the reflectance. Other embodiments of this aspect include corresponding computer systems, apparatus, and computer programs recorded on one or more computer storage devices, each configured to perform the actions of the methods.

Implementations may include one or more of the following features. The method further including: illuminating the measurement area on the sample disposed in the process chamber using a second input beam having a second peak wavelength different from the first peak wavelength, the second input beam generated remote from the process chamber and transmitted to the first viewing window of the process chamber by the first optical fiber; receiving portions of the second input beam reflected from the measurement area at the imaging sensor as a second reflected beam, the second reflected beam transmitted from the first viewing window of the process chamber to the imaging sensor by the second optical fiber; obtaining a sequence of second images of the measurement area using the second reflected beam received at the imaging sensor, each of the second images obtained at a different time within the monitoring period, and each of the images including second pixels corresponding to different parts of the measurement area; determining a second reflectance of one or more of the second pixels within each of the second images, the one or more of the second pixels corresponding to the areas of interest within the measurement area; determining a second change in the reflectance of the one or more of the second pixels between adjacent second images in the sequence; and monitoring the etch or deposition process based on the first change in the reflectance and the second change in reflectance. The first optical fiber and the second optical fiber are separate optical fibers. The first optical fiber and the second optical fiber are the same optical fiber. The second optical fiber is a coherent or imaging fiber bundle configured to preserve a relative position of individual fibers between input and output faces of the second optical fiber. The portions of the first input beam reflected from the measurement area are provided to the imaging sensory by an objective lens system that is at least one of telecentric, broadband, diffraction limited, or spectrally parfocalized. The one or more of the first pixels form multiple areas of interest within the measurement area, and the etch or deposition process is monitored based on the change in the reflectance across the multiple areas of interest. The process chamber includes one or more additional viewing windows, and for each viewing window, the method further includes illuminating another measurement area on the sample disposed in the process chamber using another input beam generated remote from the process chamber and transmitted to another viewing window of the process chamber by another optical fiber. The first optical fiber is a first optical fiber bundle, and the second optical fiber is a second coherent or imaging optical fiber bundle. Implementations of the described techniques may include hardware, a method or process, or computer software on a computer-accessible medium.

One general aspect includes a processing system. The processing system includes a processing chamber having a viewing window disposed in a lid or side thereof, the viewing window being transparent to allow viewing of a sample during processing. The processing system also includes an imaging system including: an illuminator source configured to generate electromagnetic radiation to illuminate a measurement area on the sample; an imaging sensor configured to capture images of the measurement area on the sample; an objective lens system disposed adjacent to the viewing window, where the objective lens system is at least one of telecentric, broadband, diffraction limited, or spectrally parfocalized; a first optical fiber configured to transmit the electromagnetic radiation from the illumination source to at least part of the objective lens system for illumination of the measurement area on the sample; a second optical fiber configured to transmit the images from the objective lens system to the imaging sensor; and a controller configured to monitoring an etch or deposition by performing steps including: illuminating the measurement area on a sample using an input beam generated by the illumination source and transmitted to the viewing window by the first optical fiber; receiving portions of the input beam reflected from the measurement area at the imaging sensor as a reflected beam, the reflected beam transmitted from the viewing window of the process chamber to the imaging sensor by the second optical fiber; obtaining the images of the measurement area using the reflected beam received at the imaging sensor, each of the images obtained at a different time within a monitoring period, and each of the images including pixels corresponding to different parts of the measurement area; determining a reflectance of one or more of the pixels within each of the images, the one or more of the pixels corresponding to areas of interest within the measurement area; determining a change in the reflectance of the one or more of the pixels between adjacent ones of the images; and monitoring the etch or deposition process based on the change in the reflectance.

Further aspects, advantages, and features are apparent from the claims, description, and accompanying drawings.

BRIEF DESCRIPTION OF THE DRAWINGS

The various embodiments described herein, both as to organization and method of operation, together with features and advantages thereof, can best be understood by reference to the following detailed description and accompanying drawings, in which.

Figure 1:
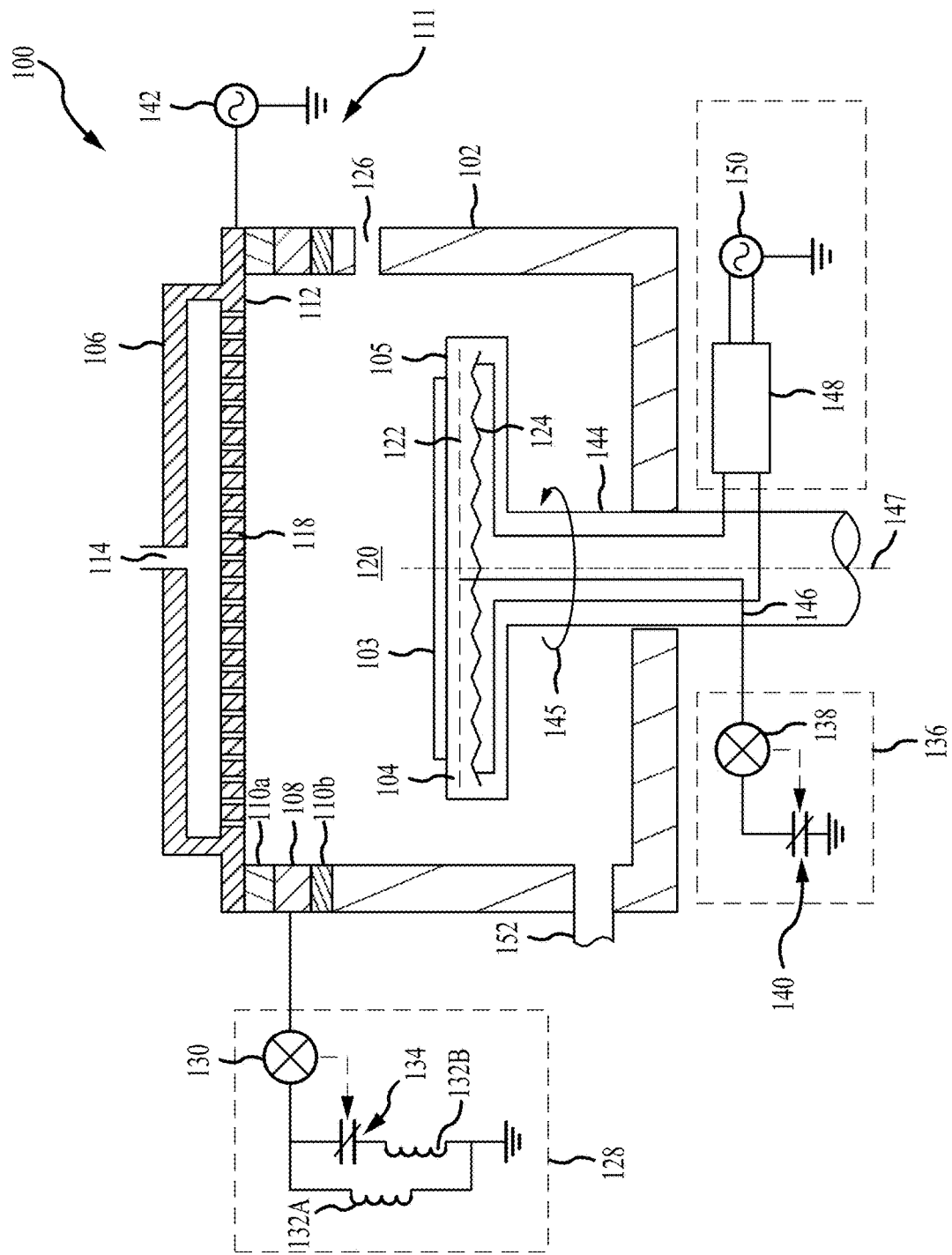
FIG. 1 is a simplified cross-sectional view of an exemplary processing chamber that may be used to implement some of the embodiments described herein.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the embodiments described herein. However, it should be understood that the various embodiments can be practiced without these specific details. In other instances, well-known methods, procedures, and components have not been described in detail so as not to obscure the described features.

Reference will be made in detail to the various embodiments, one or more examples of which are illustrated in the figures. Each example is provided by way of explanation and is not meant as a limitation. Further, features illustrated or described as part of one embodiment can be used on or in conjunction with other embodiments to yield yet further embodiments. The description is intended to include these modifications and variations.

A "specimen" or "sample" as referred to herein includes, but is not limited to, a semiconductor wafer, a semiconductor work piece, a photolithography mask, and other work pieces such as a memory disk and the like. According to some embodiments, which can be combined with other embodiments described herein, the systems and methods described are configured for or are applied to semiconductor manufacturing processes.

Embodiments described herein relate generally to improving resolution of process monitoring techniques using imaging reflectometry measurements. Changes in reflectance of each pixel or groups of pixels in an image can be determined. Depending on the imaging optics and sensors, processes can be monitored in-situ based on changes in reflectance within sub-regions of measurement areas.

FIG. 1 is a simplified cross-sectional view of an exemplary processing chamber 100 that may be used to implement some of the embodiments described herein. The figure may illustrate an overview of a system incorporating one or more aspects of the present technology, and/or which may perform one or more deposition, etching, or other processing operations according to embodiments of the present technology. Additional details of the processing chamber 100 or methods performed may be described further below. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support 104 during processing. The substrate support 104 may be rotatable, as indicated by arrow 145, along an axis 147, where a shaft 144 of the substrate support 104 may be located.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106 or may be a separate sidewall electrode.

One or more isolators 110a, 110b, which may include a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process gases into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors. The first tuning circuit 128 may be any circuit that enables variable or controllable impedance under the plasma conditions present in the processing volume 120. In some embodiments, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may flow through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the properties of the ground paths represented by the two tuning circuits 128 and 136. A set point may be delivered to the first tuning circuit 128 and the second tuning circuit 136 to provide independent control of process parameters (e.g., etch or deposition rates) and of plasma density uniformity from center to edge. In embodiments where the electronic controllers may both be variable capacitors, the electronic sensors may adjust the variable capacitors independently to maximize process parameters and minimize thickness non-uniformity.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
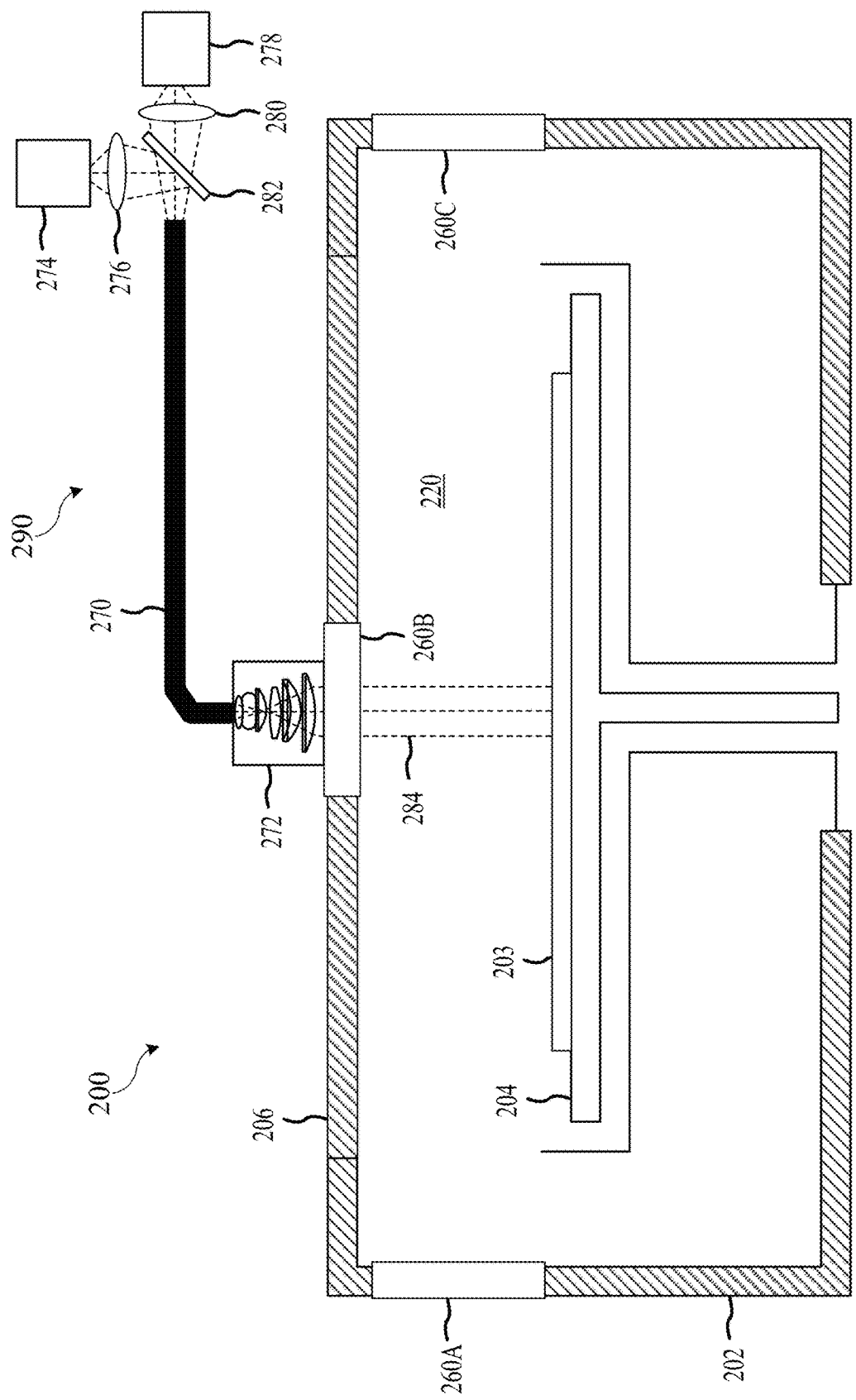
FIG. 2 is a simplified cross-sectional view of an exemplary processing system in accordance with some embodiments.

FIG. 2 is a simplified cross-sectional view of an exemplary processing system in accordance with some embodiments. The processing system includes a processing chamber 200 and an imaging system 290. The processing chamber 200 may include any feature, component, or characteristic of processing chamber 100 described above. For example, processing chamber 200 includes a chamber body 202, a substrate support 204 configured to support a substrate 203, and a lid assembly 206.

The processing chamber 200 also includes viewing windows (or view ports) 260A-260C. Although not specifically show, the processing chamber 100 in FIG. 1 may also include viewing windows. The viewing windows 260A-260C are transparent to allow viewing of the substrate 203 during processing (or emission of radiation during processing). While three viewing windows 260A-260C are shown in this example, processing chambers in accordance with embodiments described herein may include one or more viewing windows. For example, some processing chambers may include a single viewing window disposed in a lid assembly like viewing window 260B, while other processing chambers may include one or more viewing windows disposed in a side of the chamber like viewing windows 260A and/or 260C. The embodiments described herein may be implemented with any processing chamber that includes at least one viewing window, and the embodiments are not otherwise limited to a particular number or location of the viewing windows as long as a surface of the substrate 203 is visible through the viewing window. A size of the viewing windows 260A-260C may vary in different chamber designs, and in some configurations may be, for example, on the order of a few centimeters or larger in dimeter or along a side.

In the example of FIG. 2, the viewing window 260B is used to allow the imaging system 290 to obtain images of the substrate 203 during processing. The imaging system 290 is configured to capture images of a measurement area on the substrate 203 at a resolution determined by an objective lens system 272 and an imaging sensor 278. The images can be used to perform reflectivity measurements on a pixel-by-pixel basis in some embodiments.

The objective lens system 272 is at least one of telecentric, broadband, diffraction limited, or spectrally parfocalized. In some embodiments, the objective lens system 272 does not include any conductors and/or does not have electromagnetic properties that could interfere with a plasma in the processing chamber. Conversely, the strong electromagnetic field to generate the plasma may not have any adverse effect on the structure of the imaging objective lens. In some embodiments, the objective lens system 272 is telecentric, broadband, diffraction limited, and spectrally parfocalized. These features allow the objective lens system 272 to form the images at an entrance of the fiber-optic image conduit 270 at a resolution that enables process monitoring of one or more sub-regions (e.g., pixels or groups of pixels) within the measurement area. Merely collecting light reflected from the sample is not sufficient to enable process monitoring of at this level.

The imaging sensor 278 may be a digital camera that includes, for example, a complimentary metal-oxide-semiconductor (CMOS) sensor or a charge-coupled device (CCD) sensor.

A fiber-optic image conduit 270 allows the imaging sensor 278 and an illumination source 274 to be located remote from the processing chamber 200 since the space immediately next to the viewing window 260B is often in an environment that is hostile to electronic parts of the imaging system 290. The fiber-optic image conduit 270 may be a coherent or imaging fiber bundle. In embodiments that use a coherent or imaging fiber bundle, relative positions of individual fibers may be preserved between input and output faces of the coherent fiber bundle. The objective lens system 272 forms an image of the measurement area observed through the viewing window 260B at the entrance of the fiber-optic image conduit 270, and the image is transported with no distortion to the imaging sensor 278. A relay lens system 280 may be used to form the image at the end of the fiber-optic image conduit 270 onto a surface of a detector at the imaging sensor 278.

A lens system 276 may be used to focus or direct electromagnetic radiation from the illumination source 274 into the fiber-optic image conduit 270. A beam splitter 282 may be used to allow the illumination source 274 and the imaging sensor 278 to use the same fiber-optic image conduit 270. The electromagnetic radiation from the illumination source 274 is transported to the viewing window 260B to illuminate the measurement area on the substrate 203. In an embodiment, the illumination source 274 includes one or more light emitting diodes (LEDs) and/or laser diodes configured to provide illumination at specific wavelengths. In another embodiment, the illumination source 274 includes a broadband source configured to provide broadband illumination, or the broadband source may be filtered to provide illumination at specific wavelengths.

In some embodiments that use a plurality of LEDs and/or laser diodes, illumination can be varied to improve measurement results. For example, if the substrate 203 or a particular region on the substrate 203 has a low reflectivity at a particular wavelength, incident illumination power at that wavelength can be increased to improve detection sensitivity. This can be achieved either by increasing output power at the particular wavelength or by increasing integration time at the particular wavelength.

Figure 3:
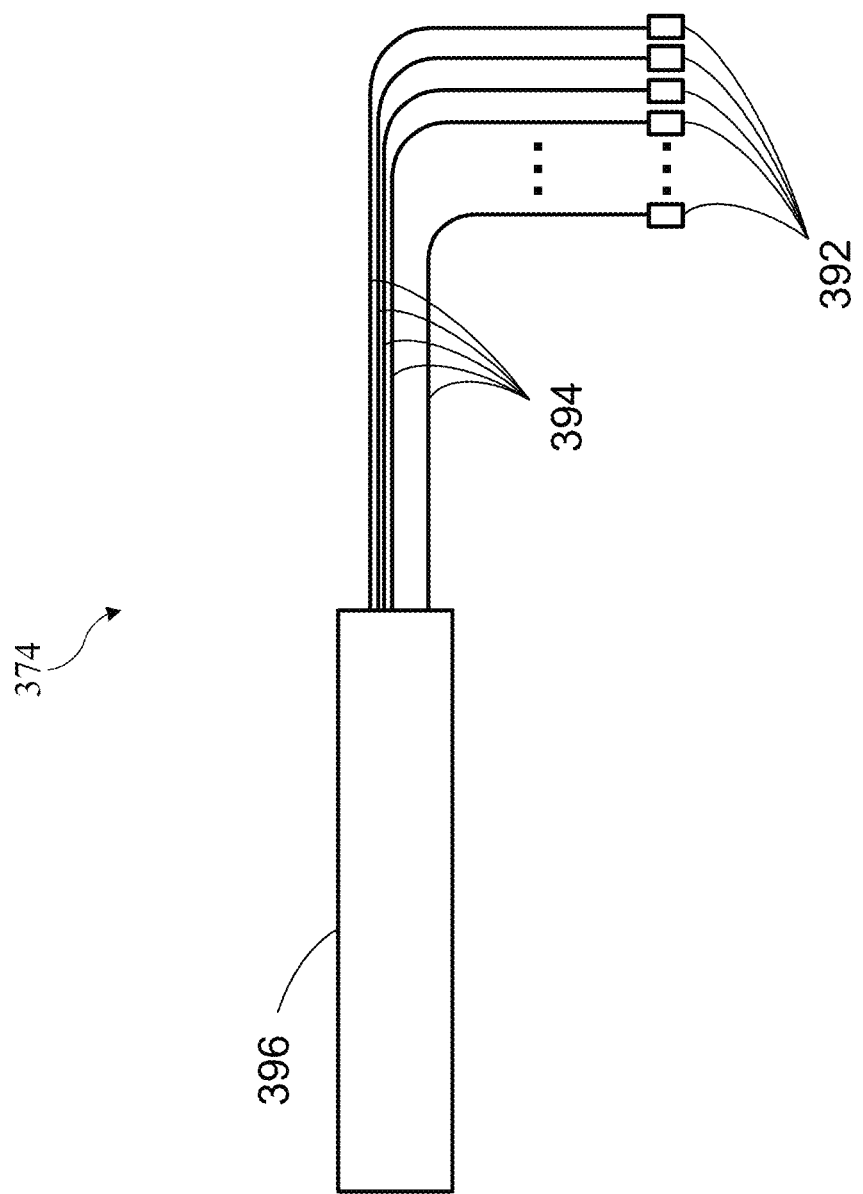
FIG. 3 is a simplified cross-sectional view of a multi-wavelength light source.

FIG. 3 is a simplified cross-sectional view of a multi-wavelength illumination source 374 that may be used in some embodiments. The multi-wavelength illumination source 374 may be used, for example, as part of the illumination source 274 of FIG. 2. The multi-wavelength illumination source 374 in this example includes a plurality of sources 392, a plurality of optical fibers 394, and an optical fiber or fiber bundle 396. The sources 392 may each include one or more light emitting diodes (LEDs) and/or laser diodes (LDs). Each of the sources 392 generates a beam of electromagnetic radiation, and at least some of the beams may be generated at different nominal wavelengths. The electromagnetic radiation from the sources 392 is transmitted using the plurality of optical fibers 394 to the optical fiber or fiber bundle 396.

In an embodiment, the multi-wavelength illumination source 374 sequentially generates different ones of the beams and/or sequentially generates combinations of multiple beams. Output power of each source 392 may be independently controlled and adjusted so that the signal at the imaging sensor 278 is close to saturation at each wavelength to maximize signal to noise ratio. Each of the sources 392 may have sufficient output power to enable high speed measurements (or measurements at or near a readout speed of the imaging sensor 278).

Figure 4B:
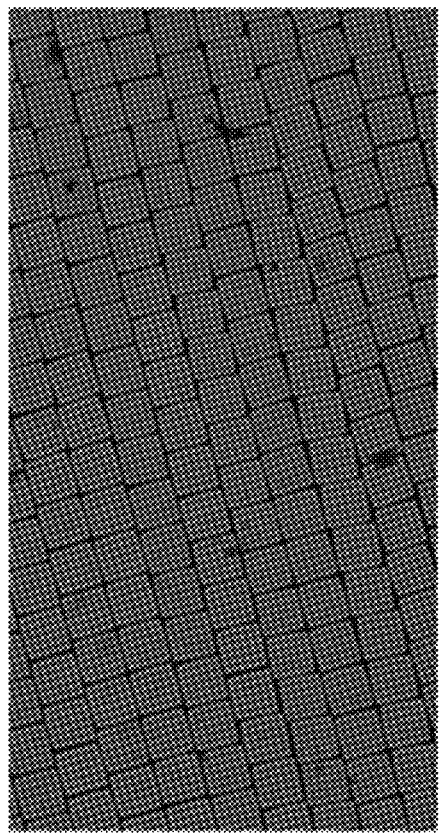
FIGS. 4A-4B are exemplary images of a patterned substrate obtained during a semiconductor manufacturing process in accordance with some embodiments.
Figure 4A:
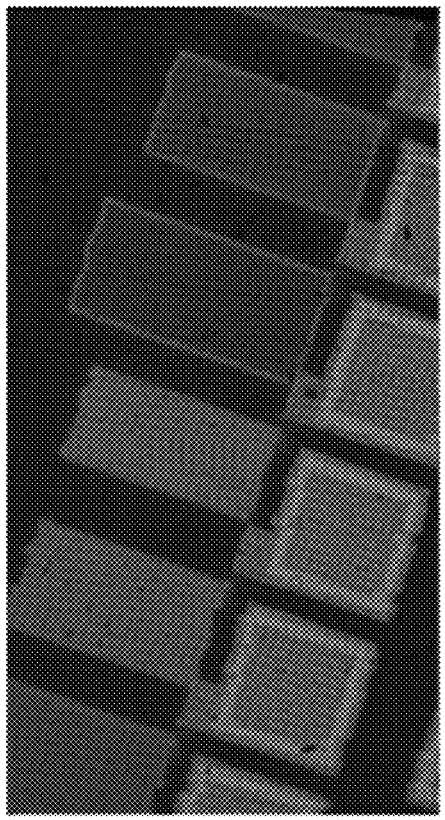

FIG. 4A is an exemplary image of a patterned substrate obtained in accordance with some embodiments. Details of the structures are shown in FIG. 4B at a higher resolution, where the individual fibers can be seen. In embodiments where the fiber-optic image conduit 270 includes a coherent fiber bundle, any imperfection in the coherent fiber bundle can be taken into account when choosing a region of the substrate 203 to be viewed during processing. In addition, variations in transmissivity of individual fibers can be accounted for by pre-mapping fiber transmissivity to balance the images.

In the example shown in FIG. 2, the fiber-optic image conduit 270 performs the dual role of transmitting images of the measurement area to the imaging sensor 278, and transmitting electromagnetic radiation from the illumination source 274 to the objective lens system 272. The objective lens system 272 may be telecentric, diffraction limited, and corrected over a wide wavelength range (such as 350 nm-1100 nm). Other wavelength ranges are also possible. The objective lens system 272 provides substantially telecentric illumination over the measurement area. The substantially telecentric illumination may have a telecentricity error of 0.1 degree or less over a wavelength range of 350 nm-1100 nm. This ensures that the electromagnetic radiation is provided substantially perpendicular to a surface of the substrate 203. In this manner, image quality and optical behavior of the system is independent of the position of any given point within the measurement area. That is, the surface of the substrate 203 can act as a true reflectometer over the entire measurement area on a point by point basis. Further details are provided in U.S. Publication No. 2020/0355609, the entire contents of which are incorporated herein by reference.

The system of FIG. 2 can also be used to monitor characteristics of the plasma formed in a processing volume 220 above the substrate 203. Plasmas may emit radiation that can be captured by the objective lens system 272 so that a spatial distribution of the plasma can be determined using the imaging sensor 278. In some embodiments, a filter (e.g., a rotating wheel or liquid crystal) may be included with the imaging sensor 278 and disposed in front of the detector. In other embodiments, a filter may be included with the objective lens system 272 and disposed in front of the fiber-optic image conduit 270. Individual full frame images of the plasma may be captured for specific transmission wavelengths. For example, a frame rate of the imaging sensor 278 may be synchronized with a position of the rotating wheel so that each image captures the emission at a particular wavelength.

Alternatively, the imaging sensor 278 may include a two-dimensional hyperspectral imager that has wavelength filters embedded in front of a focal array detector so that adjacent pixels of the detector can receive a different wavelength of light.

The plasma used during a typical dry etching process will emit radiation inside the processing chamber. Emissions from this radiation, whose spectral components are indicative of the various constituents present, can be detected by the imaging sensor 278 even when the illumination source 274 is not used. The plasma emissions provide a background signal at the imaging sensor 278 that can reduce a dynamic range available at the detector, introduce erroneous reflectivity measurements, and/or generate shot noise in the detection electronics.

Figure 5:
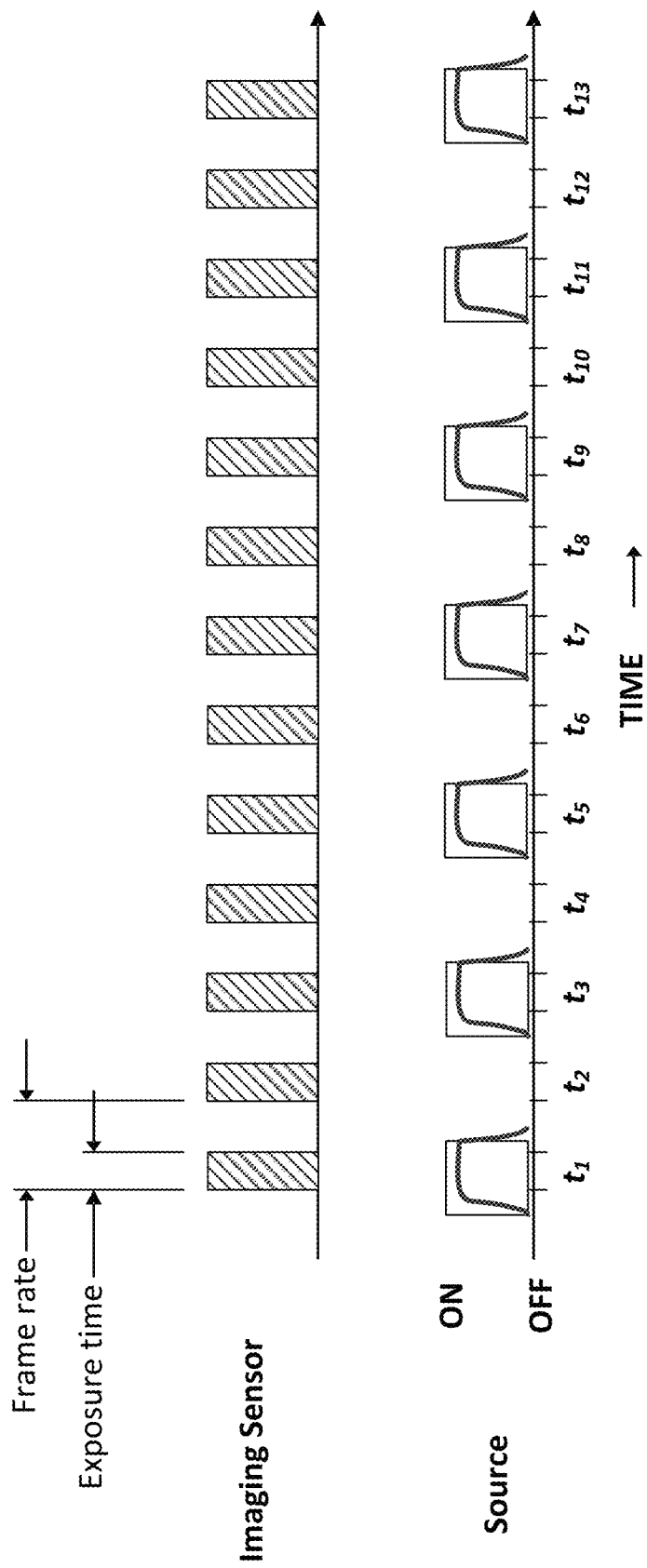
FIG. 5 is a timing diagram illustrating a method for improving process monitoring sensitivity in accordance with an embodiment.

In some embodiments, effects of the plasma emissions can be quantified and their impact on substrate reflectivity measurements reduced. As an example of how this can be done, FIG. 5 provides a timing diagram illustrating a method for improving process monitoring sensitivity in accordance with an embodiment. This figure shows a timing sequence for capturing images on a frame by frame basis. The sequence on the bottom shows a schedule for sequentially turning ON and OFF the illumination source 274. In a first frame $t_1$, the source is ON and electromagnetic radiation captured by the imaging sensor 278 is due to instantaneous sample reflectance at the specific wavelength plus background plasma emissions. In the next frame $t_2$, the source is OFF so that only plasma emissions are captured. In the following frame $t_3$, the source is ON using the same or a different wavelength of electromagnetic radiation as the first frame, and so forth.

The sequence on the top shows a schedule for obtaining images using the imaging sensor 278. Since the plasma emissions may be continuously changing, a "corrected" image of the substrate reflectivity at a given wavelength may be constructed. In an embodiment, the corrected image may be constructed using an average plasma emission image formed using a frame before and a frame after a given ON condition. The average plasma emission image may be subtracted from the image obtained during the ON condition. Depending on the frame rate and change in the plasma emissions, this process can remove or reduce direct influences of the plasma emissions from the substrate reflectivity measurements. A certain amount of additive shot noise may remain but it should be negligible.

As explained previously, the fiber-optic image conduit 270 shown in FIG. 2 performs the dual role of transmitting the electromagnetic radiation from the illumination source 274 and transferring an image of the substrate 203 to the imaging sensor 278. In this process, the electromagnetic radiation encounters many surfaces, starting with the proximal and distal ends of the fiber-optic image conduit 270, followed by the various constituent lenses of the objective lens system 272, and surfaces of the viewing window 260B before reaching a measurement area on the substrate 203. At each surface, a certain amount of electromagnetic radiation is reflected back toward the beam splitter 282 and into the imaging sensor 278. Thus, the resulting image of the measurement area on the substrate 203 includes back reflected electromagnetic radiation. This can reduce the dynamic range available at the detector and generate shot noise in the detection electronics.

Figure 6:
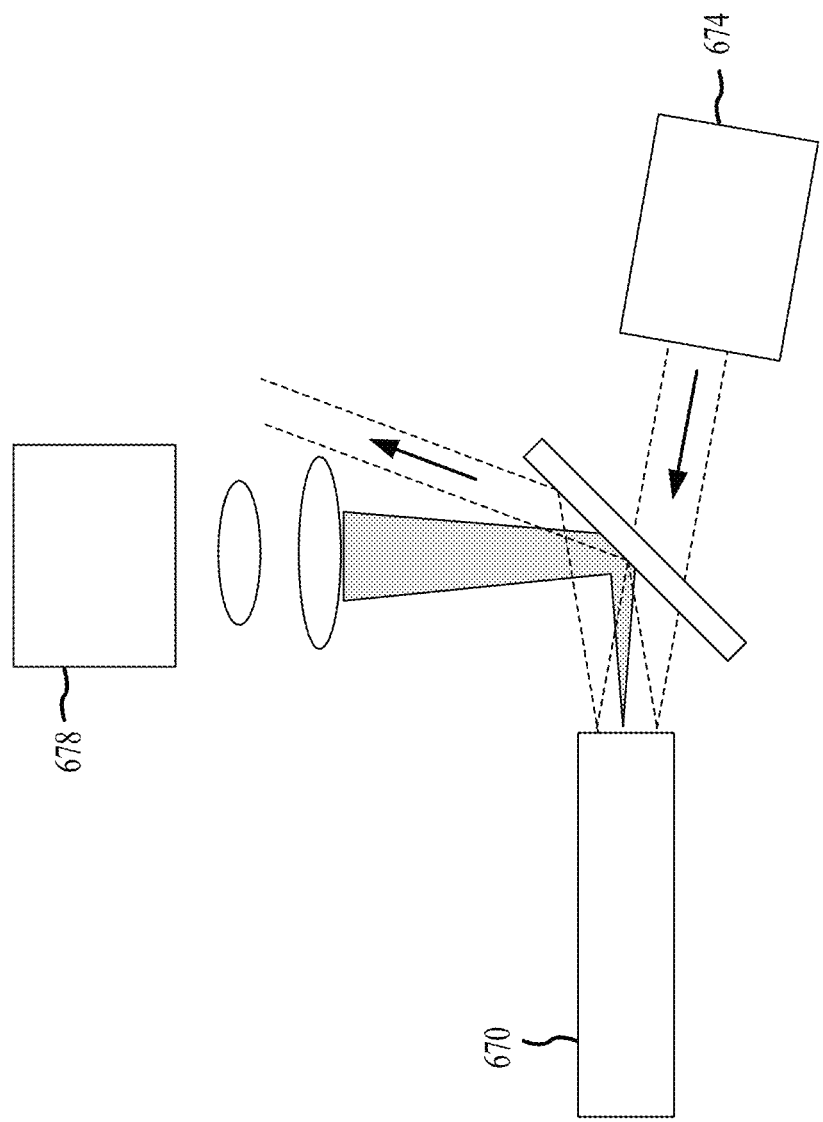
FIGS. 6-7 are simplified cross-sectional views of portions of an imaging system that illustrate exemplary methods for reducing measurement noise in accordance with some embodiments.

In some embodiments, effects of the back reflected electromagnetic radiation can be reduced. As an example of how this can be done, FIG. 6 is a simplified cross-sectional view of a portion of an imaging system that illustrates and exemplary method for reducing measurement noise in accordance with an embodiment. In this approach, a central axis of a beam from an illumination source 674 is tilted relative to a proximal end of a fiber-optic image conduit 670. As shown in this example, with the central axis of the beam tilted, the back reflected electromagnetic radiation does not enter the imaging sensor 678. There may be minimal impact on the electromagnetic radiation entering the fiber-optic image conduit 670 if the acceptance angle of the fiber-optic image conduit 670 is greater than that of the imaging sensor 678.

Figure 7:
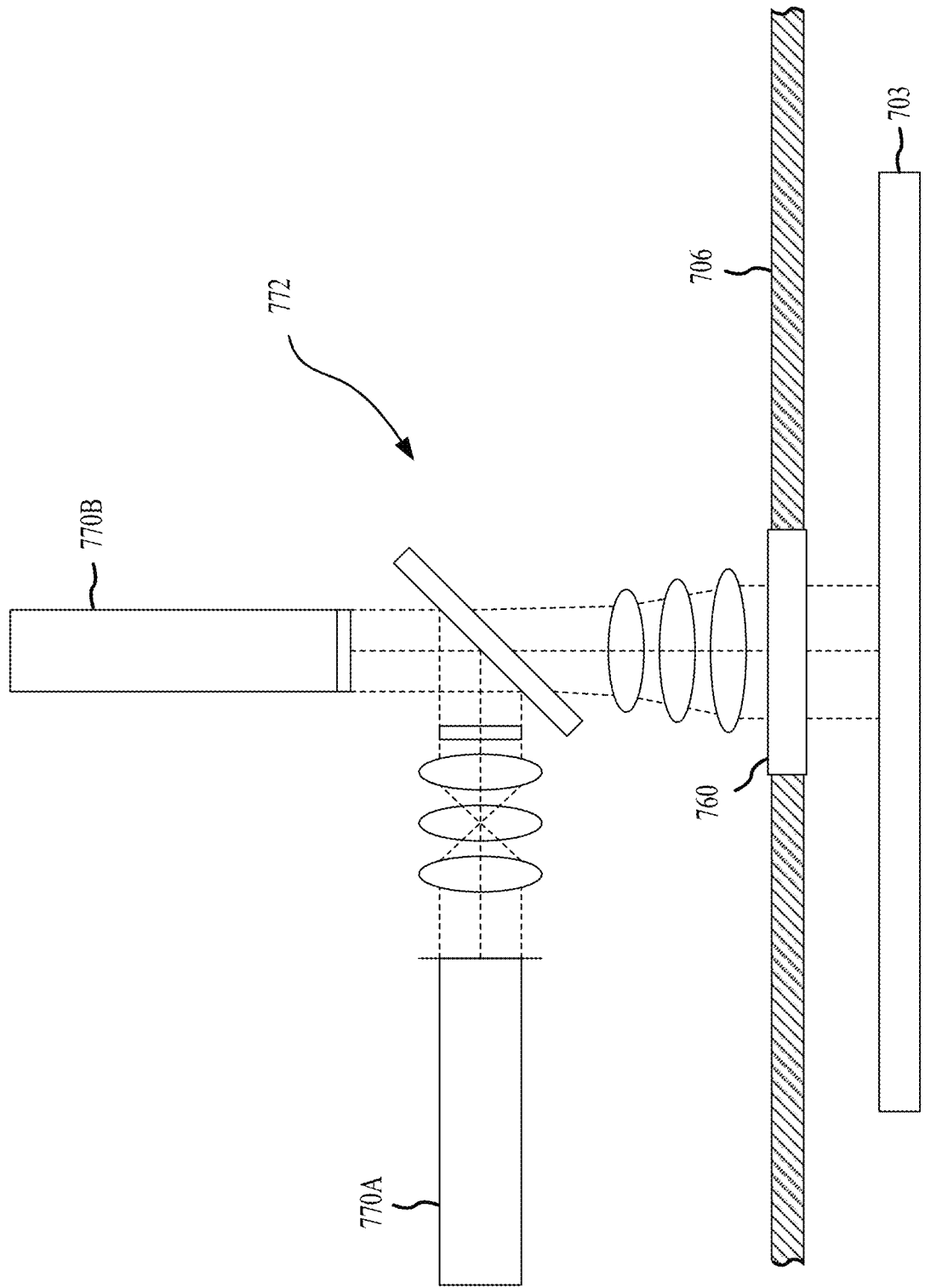

FIG. 7 provides another example for reducing effects of the back reflected electromagnetic radiation. In this approach, the illumination and imaging channels are separate. As shown in this figure, an objective lens system 772 includes a beam splitter to provide two separate ports. The electromagnetic radiation from the illumination source is provided into one of the ports using a fiber light guide 770B. The electromagnetic radiation reflected from a substrate 203 proceeds through the rest of the elements of the objective lens system 772 to produce an image at the distal end of a fiber-optic image conduit 770A. The illumination electromagnetic radiation and reflected electromagnetic radiation pass through a viewing window 760 in a lid assembly 706 of a processing chamber. This configuration avoids the back reflected electromagnetic radiation from many of the lens elements of the objective lens system 772. In addition, the back-reflected light from the proximal end of the fiber light guide 770B can be reduced. As a result, the dynamic range of the detector is better utilized, and the shot noise due to the back reflected electromagnetic radiation is reduced. This approach also reduces a mismatch in numerical aperture (NA) of the fiber-optic image conduit 770A and the objective lens system 772.

Figure 8:
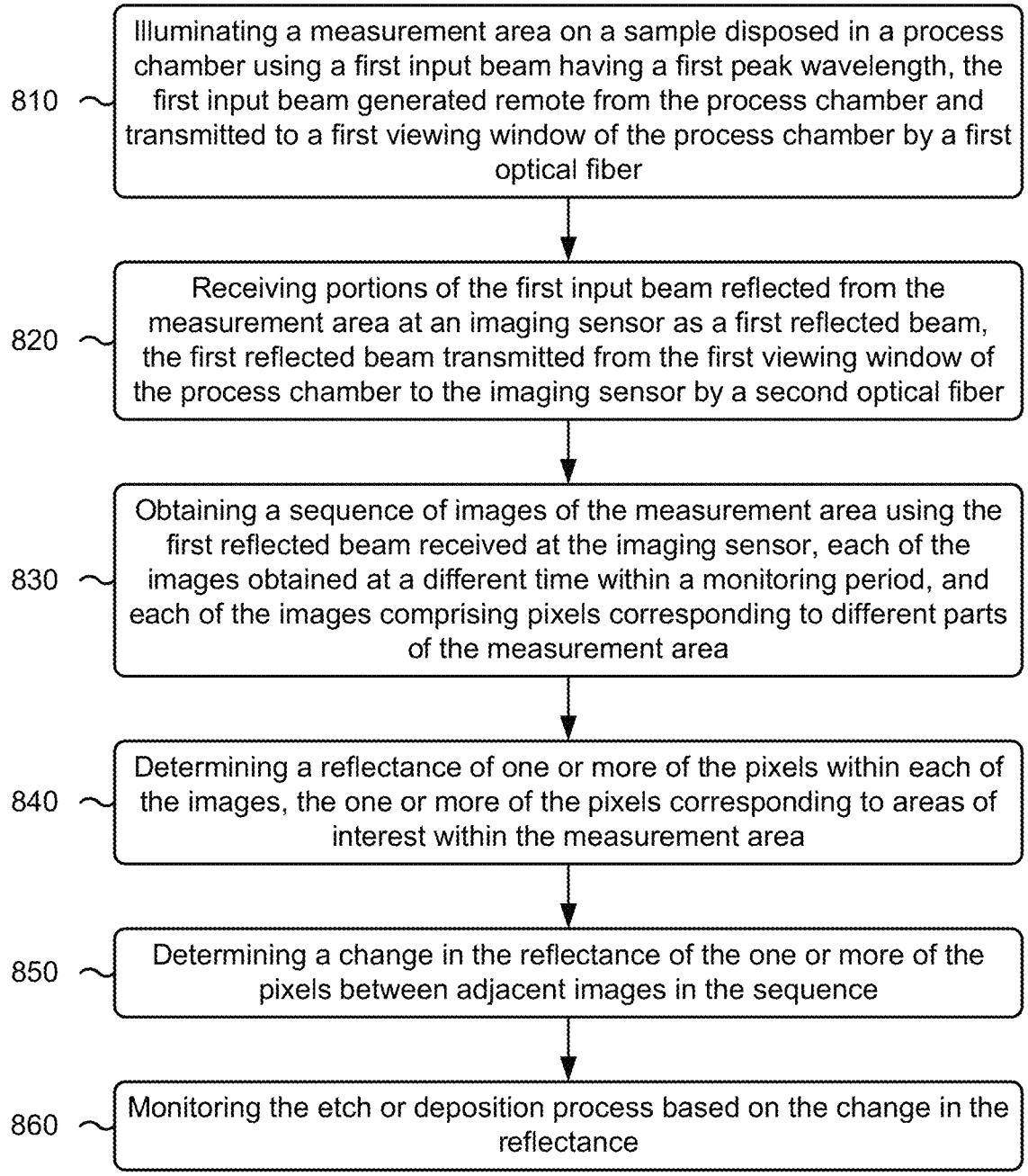
FIG. 8 is a flowchart illustrating an exemplary method for monitoring a semiconductor manufacturing process in accordance with an embodiment.

FIG. 8 is a flowchart illustrating an exemplary method for monitoring a semiconductor manufacturing process in accordance with an embodiment. In this example, the semiconductor manufacturing process is an etch or deposition process. The method includes illuminating a measurement area on a sample disposed in a process chamber using a first input beam having a first peak wavelength, the first input beam generated remote from the process chamber and transmitted to a first viewing window of the process chamber by a first optical fiber (810). The first input beam may be generated at an illumination source and transmitted to the first viewing window of the processing chamber using the fiber-optic image conduit as described with regard to FIG. 2. The illumination source may include a multi-wavelength illumination source as described with regard to FIG. 3.

The method also includes receiving portions of the first input beam reflected from the measurement area at an imaging sensor as a first reflected beam, the first reflected beam transmitted from the first viewing window of the process chamber to the imaging sensor by a second optical fiber (820). The first optical fiber and the second optical fiber may be the same or different coherent fibers and/or coherent fiber bundles. An objective lens system like that described with regard to FIG. 2 may be used to illuminate the measurement area and to provide an image of the measurement area at an input to the second optical fiber.

The method also includes obtaining a sequence of images of the measurement area using the first reflected beam received at the imaging sensor, each of the images obtained at a different time within a monitoring period, and each of the images comprising pixels corresponding to different parts of the measurement area (830).

The method also includes determining a reflectance of one or more of the pixels within each of the images, the one or more of the pixels corresponding to areas of interest within the measurement area (840). The reflectance of all the pixels may be determined or the reflectance of only certain pixels or groups of pixels corresponding to the areas of interest may be determined.

The method also includes determining a change in the reflectance of the one or more of the pixels between adjacent images in the sequence (850), and monitoring the etch or deposition process based on the change in the reflectance (860). Monitoring may include determining an etch rate and or end point of an etching process, or determining a deposition rate of a deposition process.

It should be appreciated that the specific steps illustrated in FIG. 8 provide particular methods for monitoring semiconductor manufacturing process according to some embodiments. Other sequences of steps may also be performed according to alternative embodiments. For example, alternative embodiments may perform the steps outlined above in a different order. Moreover, the individual steps illustrated in FIG. 8 may include multiple sub-steps that may be performed in various sequences. Furthermore, additional steps may be added or removed depending on the particular application.

While the foregoing is directed to specific embodiments, other and further embodiments may be devised without departing from the basic scope thereof. For example, features of one or more embodiments of the invention may be combined with one or more features of other embodiments without departing from the scope of the invention. The specification and drawings are, accordingly, to be regarded in an illustrative rather than a restrictive sense. Thus, the scope of the present invention should be determined not with reference to the above description, but should be determined with reference to the appended claims along with their full scope of equivalents.

What is claimed is:

1. A method for monitoring an etch or deposition process using image-based in-situ process monitoring, the method comprising:

illuminating a measurement area on a sample disposed in a process chamber using a first input beam of electromagnetic radiation having a first peak wavelength, the first input beam generated remote from the process chamber and transmitted to at least part of an objective lens system by a first optical fiber, the objective lens system being telecentric, broadband, diffraction limited, and spectrally parfocalized, and the objective lens system disposed adjacent to a first viewing window of the process chamber, the first viewing window disposed on a lid or side of the process chamber and being transparent to allow viewing of the sample during processing;

receiving portions of the first input beam reflected from the measurement area at an imaging sensor, the imaging sensor configured to capture images of the measurement area on the sample, the portions of the first input beam reflected from the measurement area received as a first reflected beam, the first reflected beam transmitted from the objective lens system to the imaging sensor by a second optical fiber;

obtaining a sequence of first images of the measurement area using the first reflected beam received at the imaging sensor, each of the first images obtained at a different time within a monitoring period, and each of the first images comprising first pixels corresponding to different parts of the measurement area;

determining a first reflectance of one or more of the first pixels within each of the first images, the one or more of the first pixels corresponding to areas of interest within the measurement area;

determining a first change in the reflectance of the one or more of the first pixels between adjacent first images in the sequence; and monitoring the etch or deposition process based on the first change in the reflectance.

2. The method of claim 1 further comprising:

illuminating the measurement area on the sample disposed in the process chamber using a second input beam having a second peak wavelength different from the first peak wavelength, the second input beam generated remote from the process chamber and transmitted to the objective lens system by the first optical fiber;

receiving portions of the second input beam reflected from the measurement area at the imaging sensor as a second reflected beam, the second reflected beam transmitted from the objective lens system to the imaging sensor by the second optical fiber;

obtaining a sequence of second images of the measurement area using the second reflected beam received at the imaging sensor, each of the second images obtained at a different time within the monitoring period, and each of the images comprising second pixels corresponding to different parts of the measurement area;

determining a second reflectance of one or more of the second pixels within each of the second images, the one or more of the second pixels corresponding to the areas of interest within the measurement area;

determining a second change in the reflectance of the one or more of the second pixels between adjacent second images in the sequence; and monitoring the etch or deposition process based on the first change in the reflectance and the second change in reflectance.

3. The method of claim 1 wherein the first optical fiber and the second optical fiber are separate optical fibers.

4. The method of claim 1 wherein the first optical fiber and the second optical fiber use a same fiber-optic image conduit.

5. The method of claim 1 wherein the second optical fiber is a coherent or imaging fiber bundle configured to preserve a relative position of individual fibers between input and output faces of the second optical fiber.

6. The method of claim 1 wherein the one or more of the first pixels form the areas of interest within the measurement area, and the etch or deposition process is monitored based on the change in the reflectance across the areas of interest.

7. The method of claim 1 wherein the process chamber includes one or more additional viewing windows, and for each viewing window, the method further comprises illuminating another measurement area on the sample disposed in the process chamber using another input beam generated remote from the process chamber and transmitted to another viewing window of the process chamber by another optical fiber.

8. The method of claim 1 wherein the first optical fiber is a first optical fiber bundle, and the second optical fiber is a second coherent or imaging optical fiber bundle.

9. A processing system comprising:

a processing chamber having a viewing window disposed in a lid or side thereof, the viewing window being transparent to allow viewing of a sample during processing;

an imaging system comprising:

an illuminator source configured to generate electromagnetic radiation to illuminate a measurement area on the sample;

an imaging sensor configured to capture images of the measurement area on the sample;

an objective lens system disposed adjacent to the viewing window, wherein the objective lens system is telecentric, broadband, diffraction limited, and spectrally parfocalized;

a first optical fiber configured to transmit the electromagnetic radiation from the illumination source to at least part of the objective lens system for illumination of the measurement area on the sample;

a second optical fiber configured to transmit the images from the objective lens system to the imaging sensor; and a controller configured to monitor an etch or deposition by performing steps comprising:

illuminating the measurement area on a sample using an input beam generated by the illumination source and transmitted to the objective lens system by the first optical fiber;

receiving portions of the input beam reflected from the measurement area at the imaging sensor as a reflected beam, the reflected beam transmitted from the objective lens system to the imaging sensor by the second optical fiber;

obtaining the images of the measurement area using the reflected beam received at the imaging sensor, each of the images obtained at a different time within a monitoring period, and each of the images comprising pixels corresponding to different parts of the measurement area;

determining a reflectance of one or more of the pixels within each of the images, the one or more of the pixels corresponding to areas of interest within the measurement area;

determining a change in the reflectance of the one or more of the pixels between adjacent ones of the images; and monitoring the etch or deposition process based on the change in the reflectance.

10. The processing system of claim 9 wherein the first optical fiber and the second optical fiber are separate optical fibers.

11. The processing system of claim 9 wherein the first optical fiber and the second optical fiber use a same fiber-optic image conduit.

12. The processing system of claim 9 wherein the second optical fiber is a coherent or imaging fiber bundle configured to preserve a relative position of individual fibers between input and output faces of the second optical fiber.

13. The processing system of claim 9 wherein the first optical fiber is a first optical fiber bundle, and the second optical fiber is a second coherent or imaging optical fiber bundle.

14. The processing system of claim 9 wherein the process chamber includes one or more additional viewing windows, and for each viewing window, the controller is further configured to monitor the etch or deposition process by performing steps comprising illuminating another measurement area on the sample disposed in the process chamber using another input beam generated remote from the process chamber and transmitted to another viewing window of the process chamber by another optical fiber.

\* \* \* \* \*